(12) United States Patent
Tran et al.

(10) Patent No.: US 8,749,939 B2
(45) Date of Patent: Jun. 10, 2014

(54) METHOD AND SYSTEM FOR SHOOT-THROUGH PROTECTION

(75) Inventors: Ken Tran, North Chelmsford, MA (US); Feng Tian, Salem, NH (US); Xing Chen, Lexington, MA (US)

(73) Assignee: MKS Instruments, Inc., Andover, MA (US)

( * ) Notice: Subject to any disclaimer, the term of this patent is extended or adjusted under 35 U.S.C. 154(b) by 362 days.

(21) Appl. No.: 13/106,920

(22) Filed: May 13, 2011

(65) Prior Publication Data

US 2012/0287545 A1  Nov. 15, 2012

(51) Int. Cl.
| | |
|---|---|
| H02H 3/08 | (2006.01) |
| H02M 1/38 | (2007.01) |
| H03K 17/082 | (2006.01) |
| H02M 3/337 | (2006.01) |

(52) U.S. Cl.
CPC ......... *H03K 17/0822* (2013.01); *H02M 3/337* (2013.01); *H03K 2217/0036* (2013.01); *H02M 1/38* (2013.01)
USPC ....................................................... 361/101

(58) Field of Classification Search
None
See application file for complete search history.

(56) References Cited

U.S. PATENT DOCUMENTS

| | | | | |
|---|---|---|---|---|
| 4,720,667 | A | | 1/1988 | Lee et al. |
| 5,025,360 | A | * | 6/1991 | Latos ............................... 363/16 |
| 5,379,209 | A | * | 1/1995 | Goff ............................. 363/132 |
| 5,459,655 | A | * | 10/1995 | Mori et al. ..................... 363/132 |
| 5,550,730 | A | | 8/1996 | Seki |
| 5,576,943 | A | * | 11/1996 | Keir ........................... 363/56.05 |
| 5,929,519 | A | * | 7/1999 | Mori et al. ..................... 257/724 |
| 6,057,728 | A | | 5/2000 | Igarashi |
| 7,733,616 | B2 | * | 6/2010 | Yamada .......................... 361/31 |
| 8,072,241 | B2 | * | 12/2011 | Kouno ............................ 326/61 |
| 8,111,530 | B2 | * | 2/2012 | Ono et al. .................. 363/56.01 |
| 8,300,443 | B2 | * | 10/2012 | Takizawa ...................... 363/147 |
| 2001/0026429 | A1 | * | 10/2001 | Fukuda et al. ............... 361/93.9 |

FOREIGN PATENT DOCUMENTS

DE         40 32 014 A1     5/1991

OTHER PUBLICATIONS

Kwang-Hwa Liu, Fred C. Lee, "Resonant Switches—A Unified Approach to Improve Performances of Switching Converters," Electrical Engineering Department, Virginia Polytechnic Institute and State University, Blacksburg, Virginia 24061, pp. 1984, 344-351.

Carlos Marcelo De Oliveira Stein, and Hélio Leaes Hey, "A True ZCZVT Commutation Cell for PWM Converters," IEEE Transactions on Power Electronics, vol. 15, No. 1, Jan. 2000, pp. 185-193.

(Continued)

*Primary Examiner* — Rexford Barnie
*Assistant Examiner* — Angela Brooks
(74) *Attorney, Agent, or Firm* — Proskauer Rose LLP (57) ABSTRACT

A switching apparatus includes a first transistor, a second transistor, a first circuit module, a first current sensor and a control circuit. The first transistor includes first, second and third terminals. The first terminal of the first transistor is coupled to a first power terminal. The third terminal of the first transistor includes a gate or base of the first transistor. The second transistor includes first, second and third terminals. The first terminal of the second transistor is coupled to a second power terminal. The second terminal of the second transistor is coupled to the second terminal of the first transistor. The third terminal of the second transistor includes a gate or base of the second transistor. The first circuit module includes an inductor in parallel with a diode. The first circuit module is connected between the first terminal of the second transistor and the second power terminal.

21 Claims, 11 Drawing Sheets

(56) References Cited

OTHER PUBLICATIONS

Ilse Cervantes, David Garcia, and Daniel Noriega, "Linear Multiloop Control of Quasi-Resonant Converters," IEEE Transactions on Power Electronics, vol. 18, No. 5, Sep. 2003, pp. 1194-1201.

Esteban Sanchis, Enrique Maset, Jose A. Carrasco, Juan B. Ejea, Agustin Ferreres, Enrique Dede, Vicente Esteve, José Jordan, and Rafael Garcia-Gil, "Zero-Current-Switched Three-Phase SVM-Controlled Buck Rectifier," IEEE Transactions on Industrial Electronics, vol. 52, No. 3, Jun. 2005, pp. 679-688.

Milan Ilic and Dragan Maksimovic, "Interleaved Zero-Current-Transition Buck Converter," IEEE Transactions on Industry Applications, vol. 43, No. 6, Nov./Dec. 2007, pp. 1619-1627.

M. Jabbari, and H. Farzanefard, "Analysis and Experimental Results of Switched-Resonator-Based Buck-Boost and Inverting-Buck Converters," 2010 2nd IEEE International Symposium on Power Electronics for Distributed Generation Systems, 2010, pp. 412-416.

M. Jabbari, "Resonant Inverting-Buck Converter," IET Power Electron., vol. 3, ISS. 4, 2010, pp. 571-577.

Guichao Hua, Eric X. Yang, Yimin Jiang, and Fred C. Lee, "Novel Zero-Current-Transition PWM Converters," Virginia Power Electronics Center, The Bradley Department of Electrical Engineering, Virginia Polytechnic Institute & State University, Blacksburg, VA 24061, 1993, pp. 538-544.

Masoud Jabbari, "Unified Analysis of Switched-Resonator Converters," Future IEEE Publication, 1993, pp. 1-33.

M. Mamon, R. Hiramatsu, K. Harada, H. Sakamoto, "A Resonant Converter With PWM Control," pp. 247-249.

Guichao Hua, "Soft-Switching Techniques for Pulse-Width-Modulated Converters," Dissertation Submitted to the Faculty of the Virginia Polytechnic Institute and State University in Partial Fulfillment of the Requirements for the Degree of Doctor of Philosophy in Electrical Engineering, Apr. 22, 1994, pp. 1-203.

M.K. Kazimierczuk, "Analysis and Design of Buck/Boost Zero-Voltage-Switching Resonant DC/DC Convertor", IEE Proceedings, vol. 136, Pt. G, No. 4, Aug. 1989, pp. 157-166.

Milan M. Jovanović, Wojciech A. Tabisz. and Fred C. Y. Lee, "High-Frequency Off-Line Power Conversion Using Zero-Voltage-Switching Quasi-Resonant and Multiresonant Techniques," IEEE Transactions on Power Electronics. vol. 4. No. 4. Oct. 1989, pp. 459-469.

Wojciech A. Tabisz. and Fred C. Y. Lee, "Zero-Voltage-Switching Multiresonant Technique—A Novel Approach to Improve Performance of High-Frequency Quasi-Resonant Converters," IEEE Transactions on Power Electronics, vol. 4. No. 4, Oct. 1989, pp. 450-458.

Wojciech A. Tabisz and Fred C. Lee, "Principles of Quasi- and Multi-Resonant Power Conversion Techniques," Virginia Power Electronics Center, The Bradley Department of Electrical Engineering, Virginia Polytechnic Institute and State University Blacksburg, Virginia 24061, pp. 1053-1056.

Isami Norigoe, Yasue Uchiyama and Tamotsu Kohuchi, "ZVS PWM Modificated Bridge Converter Utilizing Partial Resonance," INTELEC'91 Nov. 1991, pp. 624-630.

Yu-Mng Chang, Jia-You Lee, Wen-Inne Tsai and York-Yih Sun, "An H-Soft-Switched Cell for Single-Switch Nonisolated DC-to-DC Converters," Control System Laboratory, Department of Electrical Engineering, National Cheng Kung University, Tainan, Taiwan, 1993, pp. 1077-1082.

Ahmed Elasser, and David A. Torrey, "Soft Switching Active Snubbers for DC/DC Converters," IEEE Transactions on Power Electronics, vol. 11, No. 5, Sep. 1996, pp. 710-722.

B. P. Divakar and Danny Sutanto, "Optimum Buck Converter With A Single Switch," IEEE Transactions on Power Electronics, vol. 14, No. 4, Jul. 1999, pp. 636-642.

Huijie Yu, "Driver Based Soft Switch for Pulse-Width-Modulated Power Converters," Dissertation Submitted to the Faculty of the Virginia Polytechnic Institute and State University in Partial Fulfillment of the Requirements for the Degree of Doctor of Philosophy in Electrical Engineering, Feb. 23, 2005, pp. 1-170.

Milan M. Jovanović and Yungtaek Jang "State-of-the-Art, Single-Phase, Active Power-Factor-Correction Techniques for High-Power Applications—An Overview," IEEE Transactions on Industrial Electronics, vol. 52, No. 3, Jun. 2005, pp. 701-708.

Milan M. Jovanović, (Invited Paper) "Resonant, Quasi-Resonant, Multi-Resonant and Soft-Switching Techniques—Merits and Limitation," INT. J. Electronics, vol. 77, No. 5, 1994, pp. 537-554.

Yu-Ming Chang, Jia-You Lee, Wen-Inne Tsai and York-Yih Sun, "Design and Analysis of H-Soft Switch Converters," IEE Pro. Electr. Power Appl., vol. 142, No. 4, Jul. 1995, pp. 255-261.

Wojciech A. Tabisz and Fred C. Lee, "Zero-Voltage-Switching Multi-Resonant Technique—A Novel Approach to Improve Performance of High-Frequency Quasi-Resonant Converters", Virginia Power Electronics Center, Department of Electrical Engineering, Virginia Polytechnic Institute and State University, Blacksburg, VA 24061, Apr. 1988, pp. 9-17.

Robert L. Steigerwald, "High-Frequency Resonant Transistor DC-DC Converters," IEEE Transactions on Industrial Electronics, vol. IE-31, No. 2, May 1984, pp. 181-191.

International Search Report and Written Opinion from co-pending PCT application No. PCT/US2012/037089, dated Jul. 24, 2012, 13 pages.

* cited by examiner

METHOD AND SYSTEM FOR SHOOT-THROUGH PROTECTION

FIELD OF THE INVENTION

The invention relates generally to protecting circuit components against shoot-through current, and to apparatuses for and methods of protecting circuit components against shoot-through current.

BACKGROUND OF THE INVENTION

A two-switch circuit topology typically includes a pair of switching devices that are alternately operated. For example, a power inverter can include one or more branches coupled to a DC power source. Each branch can include a pair of switching devices that are alternately operated to connect the junction between the devices to the voltage of the power source, thereby producing an alternating output. Shoot-through currents can occur if both switching devices are turned on at the same time, which can damage and/or short circuit components of the circuit and degrade the output waveform.

Figure 1:
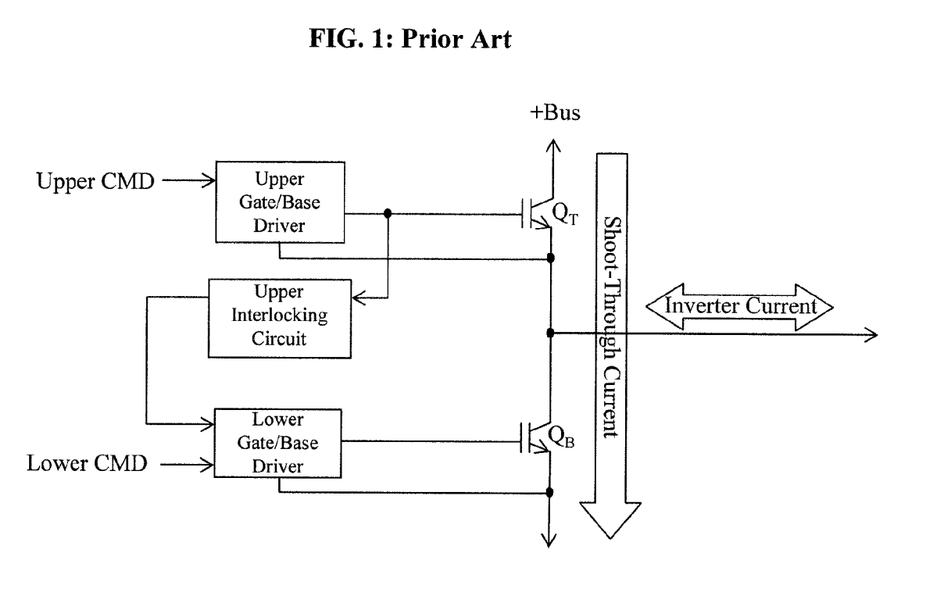
FIG. 1 illustrates a circuit diagram of an exemplary implementation of an interlocking circuit.

One method for minimizing shoot-thorough phenomenon involves the use of an interlock circuit to prevent both switching devices from being on simultaneously. Interlock circuits typically regulate switching based on a signal sensed from one of the inputs to the switching devices. For example, FIG. 1 illustrates a shoot-through protection circuit diagram using an upper interlock circuit, which is configured to turn off the lower gate driver if a signal sensed at the gate/base of the upper switching device exceeds a certain threshold. However, interlock circuits do not consider noise factors that can exist in real-world applications such as when noise is coupled into the gate of the switching devices.

Figure 2:
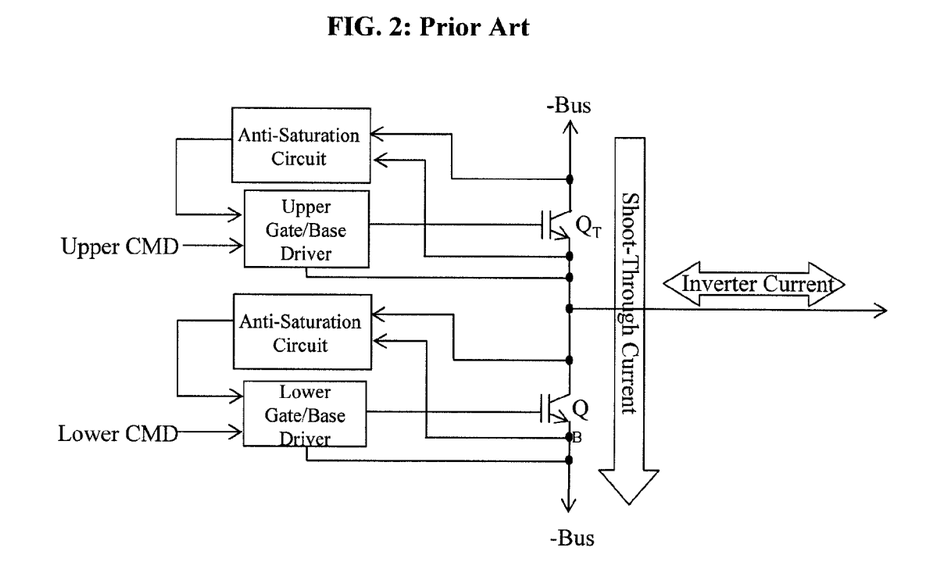
FIG. 2 illustrates a circuit diagram of an exemplary implementation of an anti-saturation circuit.

Another method for shoot-thorough protection involves the use of an anti-saturation circuit, which controls the switching device based on the measured voltage across the switching device. FIG. 2 illustrates a shoot-through protection circuit diagram using anti-saturation circuits. Each anti-saturation circuit monitors the voltage on an output terminal of a switching device—such as the drain-source terminals of a field-effect transistor (FET) or the collector-emitter terminals of a bipolar junction transistor (BJT). If the measured voltage indicates that the switching devices is entering or operating in an active or linear condition, then the anti-saturation circuit can adjust the respective driver of the gate/base to turn the switching device off. However, anti-saturation circuits can prematurely turn off the switching device due to its sensitivity.

SUMMARY OF THE INVENTION

Shoot-through current can occur when more than one switching device is turned on. Known shoot-through protection circuits include interlock protection circuits and anti-saturation protection circuits. However, interlock and anti-saturation designs are generally not reliable because they either do not account for noise factors in the environment or are too sensitive to changes in the environment resulting in premature shutdowns.

The invention features methods and circuits for protecting circuit components against shoot-through current. Any of the particular embodiments described below can realize one or more of the following advantages. Switching devices can be reliably shutdown even in the presence of noise. The risk of premature shutdowns of the switching devices can also be minimized. Active sensing can provide a more accurate approach to controlling switching than using current measured from the gate/base terminal of a transistor. In addition, the rate of increase in a shoot-through current can be delayed to provide sufficient time for appropriate feedback is processed to accurately detect the shoot-through current and enact appropriate protection measures in response to the detection.

In one aspect, a switching apparatus is provided. The switching apparatus includes a first transistor, a second transistor, a first circuit module, a first current sensor, and a control circuit. The first transistor of the switching apparatus includes first, second and third terminals. The first terminal of the first transistor is coupled to a first power terminal. The third terminal of the first transistor includes a gate or base of the first transistor. The second transistor of the switching apparatus includes first, second and third terminals. The first terminal of the second transistor is coupled to a second power terminal. The second terminal of the second transistor is coupled to the second terminal of the first transistor. The third terminal of the second transistor includes a gate or base of the second transistor. The first circuit module of the switching apparatus includes an inductor in parallel with a diode. The first circuit module is connected between the first terminal of the second transistor and the second power terminal. In addition, the first current sensor is coupled to the first circuit module or the first terminal of the second transistor. Furthermore, the control circuit is coupled to the third terminal of the first or second transistors. The control circuit includes a feedback circuit for turning off at least one of the first or second transistors based on a signal from the first current sensor.

In some embodiments, the switching apparatus further includes a second circuit module having an inductor in parallel with a diode, the second circuit module connected between the first terminal of the first transistor and the first power terminal. In some embodiments, a second current sensor is coupled to the second circuit module or the first terminal of the first transistor. The feedback circuit can be adapted to turn off at least one of the first or second transistors further based on a signal from the second current sensor.

In some embodiments, the first power terminal is connected to a positive voltage power source and the second power terminal is connected to a negative voltage power source. In this configuration, a cathode of the diode in the first circuit module can be connected to the first terminal of the second transistor and the anode of the diode in the first circuit module can connected to the second power terminal.

In some embodiments, the first power terminal is connected to a negative voltage power source and the second power terminal is connected to a positive voltage power source.

In some embodiments, the switching apparatus is included in a half-bridge circuit. In some embodiments, the switching apparatus is included in a full-bridge circuit.

In another aspect, a switching apparatus is provided. The switching apparatus can be included in a push-pull circuit. The switching apparatus includes a first circuit module, a first transistor, a second transistor, a current sensor, and a control circuit. The first circuit module of the switching apparatus includes an inductor in parallel with a diode. A first terminal of the first circuit module is coupled to a first power terminal. The first transistor of the switching apparatus includes first, second and third terminals. The first terminal of the first transistor is coupled to a second terminal of the first circuit module. The second terminal of the first transistor is coupled to a second power terminal. The third terminal of the first transistor includes a gate or base of the first transistor. The second transistor of the switching circuit includes first, second and third terminals. The first terminal of the second transistor is coupled to the second terminal of the first circuit module. The second terminal of the second transistor is coupled to the second power terminal. The third terminal of the second transistor includes a gate or base of the second transistor. In addition, the current sensor is coupled to the first circuit module. Furthermore, the control circuit is coupled to the third terminal of the first or second transistors. The control circuit includes a feedback circuit for turning off at least one of the first or second transistors based on a signal from the current sensor.

In other examples, any of the aspects above can include one or more of the following features. The first transistor can include a diode connected between the first and second terminals of the first transistor. The diode of the first transistor can be anti-parallel in polarity with the first transistor. The second transistor can include a diode connected between the first and second terminals of the second transistor. The diode of the second transistor can be anti-parallel in polarity with the second transistor.

In some embodiments, the diode in the first circuit module is a silicon-carbide diode.

In some embodiments, a gate or base voltage sensor is coupled to the third terminal of the first transistor and an interlock circuit is connected between the gate or base voltage sensor and the third terminal of the second transistor. The interlock circuit is adapted to turn off the second transistor based on a signal from the gate or base voltage sensor.

In some embodiments, the feedback circuit is configured to turn off at least one of the first or second transistors when the current sensed by the first current sensor is above a predetermined threshold for a predetermined period of time.

In some embodiments, the control circuit of the switching apparatus is a digital circuit. In some embodiments, the control circuit is an analog circuit. The control circuit can include a comparator for comparing the signal from the first current sensor to a reference signal. The feedback circuit is adapted to turn off at least one of the first or second transistors based on an output signal of the comparator.

BRIEF DESCRIPTION OF THE DRAWINGS

The advantages of the invention described above, together with further advantages, will be better understood by referring to the following description taken in conjunction with the accompanying drawings. The drawings are not necessarily to scale, emphasis instead generally being placed upon illustrating the principles of the invention.

DETAILED DESCRIPTION

Figure 3:
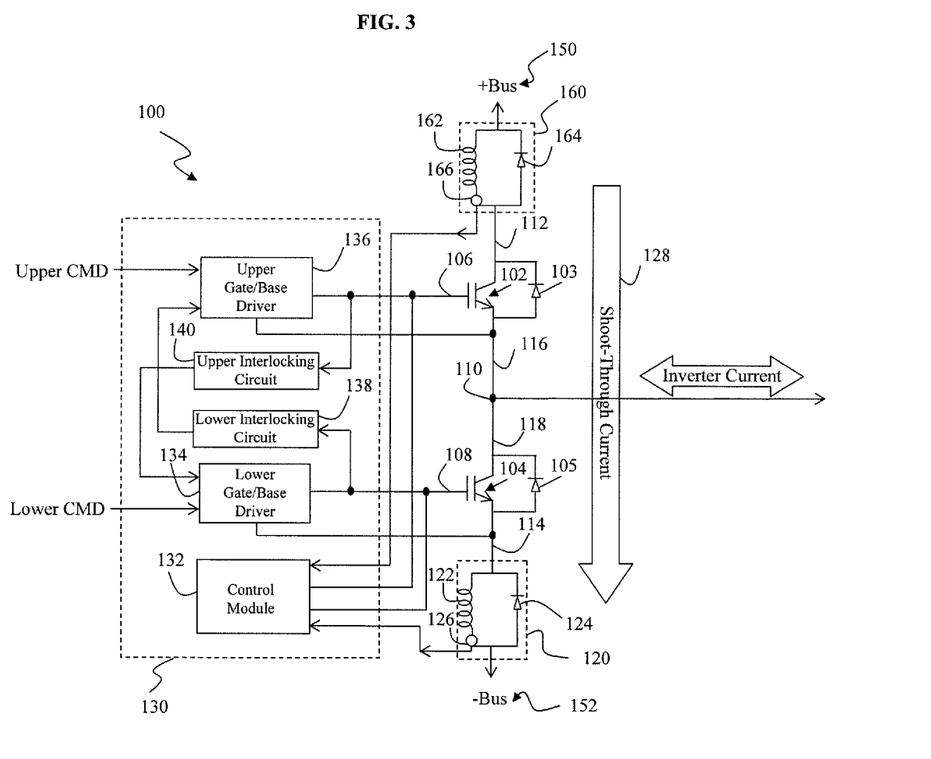
FIG. 3 illustrates a circuit diagram of a shoot-through protection circuit according to some embodiments.

The invention features methods and systems for shoot-through protection. FIG. 3 illustrates a circuit diagram of a shoot-through protection circuit 100 according to some embodiments. The protection circuit 100 includes an upper transistor 102, a lower transistor 104, a control circuit 130, and delay modules 120 and 160. The transistors 102 and 104 can be, for example, bipolar junction transistors (BJTs) and/or field-effect transistors (FETs).

The upper transistor 102 includes a gate/base terminal 106, a collector/drain terminal 112, and an emitter/source terminal 116. The lower transistor 104 includes a gate/base terminal 108, a collector/drain terminal 118 and a source/emitter terminal 114. Both transistors 102 and 104 can be in parallel with diodes 103 and 105. The collector/drain terminal 112 of the upper transistor 102 is coupled to a positive terminal 150 of a DC power supply (not shown) via the upper delay module 160. The emitter/source terminal 114 of the lower transistor 104 is coupled to a negative terminal 152 of the power supply (not shown) via the lower delay module 120. The source/emitter terminal 116 of the upper transistor 102 is coupled to the collector/drain terminal 118 of the lower transistor 104 to form a junction 110 therebetween. In normal operation, the upper and lower transistors 102 and 104 are alternately activated to couple the junction 110 to either a positive voltage +BUS at the positive terminal 150 or a negative voltage −BUS at the negative terminal 152.

The delay module 120 includes an inductor 122 in parallel with a diode 124. The cathode of the diode 124 is coupled to the emitter/source terminal 114 of the lower transistor 104 and the anode of the diode 124 is coupled to the negative terminal 152. In some embodiments, the delay module 120 additionally includes a current and/or voltage sensor 126. The delay module 160 includes an inductor 162 in parallel with a diode 164. The cathode of the diode 164 is coupled to the positive terminal 150 and the anode of the diode 164 is coupled to the collector/drain terminal 112 of the upper transistor 102. In some embodiments, the delay module 160 additionally includes a current and/or voltage sensor 166. In some embodiments, diodes 124 and/or 164 are silicon-carbide diodes, which advantageously, due to their high thermal conductivity, mitigate current spikes caused by reverse leakage current generated by, for example, the body diode 103 and/or 105.

Due to the voltage-current relationship of inductors, the inductors 122 and/or 162 prevent rapid increases in current. Accordingly, delay modules 120 and 160 can act to decrease the rate of any increase in a shoot-through current 128. Delaying the rate of increase in the shoot-through current 128 can advantageously provide sufficient time for the control circuit 130 to accurately detect the shoot-through current 128 and enact appropriate protection measures in response to the detection.

While FIG. 3 illustrates that the circuit 100 includes two delay modules (the lower delay module 120 and the upper delay module 160), other configurations can also be used. For example, in some embodiments, the circuit 100 includes only one of the delay modules 120 or 160 to provide shoot-through protection. In supplemental or alternative embodiments, the circuit 100 can also include a delay module positioned at junction 110 between the two transistors 102 and 104.

FIG. 3 also illustrates that delay modules 120 and 160 include, respectively, current and/or voltage sensors 126 and 166 at the anode of diodes 124 and 164. However, other configurations can also be used. Generally, current and/or voltage sensors can be positioned anywhere along a current path between the power terminals 150 and 152. For example, in alternative or supplemental embodiments, one or more current and/or voltage sensors can be positioned at the cathode of diodes 124 and/or 164, and/or can be positioned between the transistors 102 and 104.

The control circuit 130 includes a control module 132, a lower gate/base driver 134, an upper gate/base driver 136, and upper/lower interlocking circuits 138 and 140. The control circuit 130 can implement safety measure(s), such as disabling one or both of the transistors 102 and 104, if one or more of the voltage and/or current signals (e.g., from sensors 126 and/or 166) satisfies a predetermined criterion (e.g., exceeds a threshold level for a certain number of clock cycles). By turning off one or both of the transistors 102 and/or 104, the control module 132 advantageously can prevent damage to the circuit 100 due to shoot-through phenomenon.

In some embodiments, the control module 132 disables the lower transistor 104 by interacting with the lower gate/base driver 134 to shut off the voltage supplied to the gate/base terminal 108 of the lower transistor 104. In supplemental or alternative embodiments, the control module 132 disables the upper transistor 102 by interacting with the upper gate/base driver 136 to shut off the voltage supplied to the gate/base terminal 106. The control module 132 thus can provide shoot-through protection by actively sensing current through the collector/drain terminal or the emitter/source terminal of a switching transistor. Such active sensing can advantageously provide a more accurate approach to controlling switching than using current measured from the gate/base terminal of a transistor because the measured signal is less susceptible to noise and other environmental factors.

In some embodiments, in addition to the active shoot-through protection provided by the control module 132, one or more interlocking circuits 138 and 140 can be used to provide additional measures of protection against shoot-through current 128. For example, a lower interlocking circuit 138 operates by detecting current and/or voltage signals supplied by the lower gate/base driver 134 to the gate/base terminal 108 of the lower transistor 104. If the detected signal satisfies a predetermined criterion (e.g., is greater than a threshold level, which can indicate that the lower transistor 104 is turned on), then the lower interlocking circuit 138 can interact with the upper gate/base driver 136 to turn off the voltage supplied to the upper transistor 102, thus ensuring that the transistors 102 and 104 are both not simultaneously turned on. In a similar fashion, an upper interlocking circuit 140 operates by detecting current and/or voltage signals supplied by the upper gate/base driver 136 to the gate/base terminal 106 of the upper transistor 102. If the detected signal satisfies a predetermined criterion (e.g., is greater than a threshold level, which indicates that the upper transistor 102 is turned on), then the upper interlocking circuit 140 interacts with the lower gate/base driver 134 to turn off the lower transistor 104.

FIGS. 4A-4F illustrate the normal operating conditions 200a-200f (e.g., in the absence of shoot-through phenomenon) of the shoot-through protection circuit 100 of FIG. 3. The portions of the diagrams highlighted by thick lines indicate active components. For purposes of illustration, normal operating conditions 200a-200f assume that a load 203, which includes an inductor 202 in series with a resistor 204, is connected to the junction 110. However, other load configurations are possible (e.g., any load with arbitrary impedance or combination of resistor elements, capacitor elements, inductor elements or any combination thereof).

The upper switching module 210 includes upper transistor 102 in parallel with a body diode 103. The cathode of the body diode 103 is coupled to the drain of the upper transistor 102 and the anode of the body diode 103 is coupled to the source of the upper transistor 102 such that the body diode 103 is anti-parallel in polarity with the upper transistor 102. Similarly, the lower switching module 224 includes lower transistor 104 in parallel with a body diode 105. The cathode of the body diode 105 is coupled to the drain of the lower transistor 104 and the anode of the body diode 105 is coupled to the source of the lower transistor 104 such that the body diode 105 is anti-parallel in polarity with the lower transistor 104.

Figures 4A, 4B:
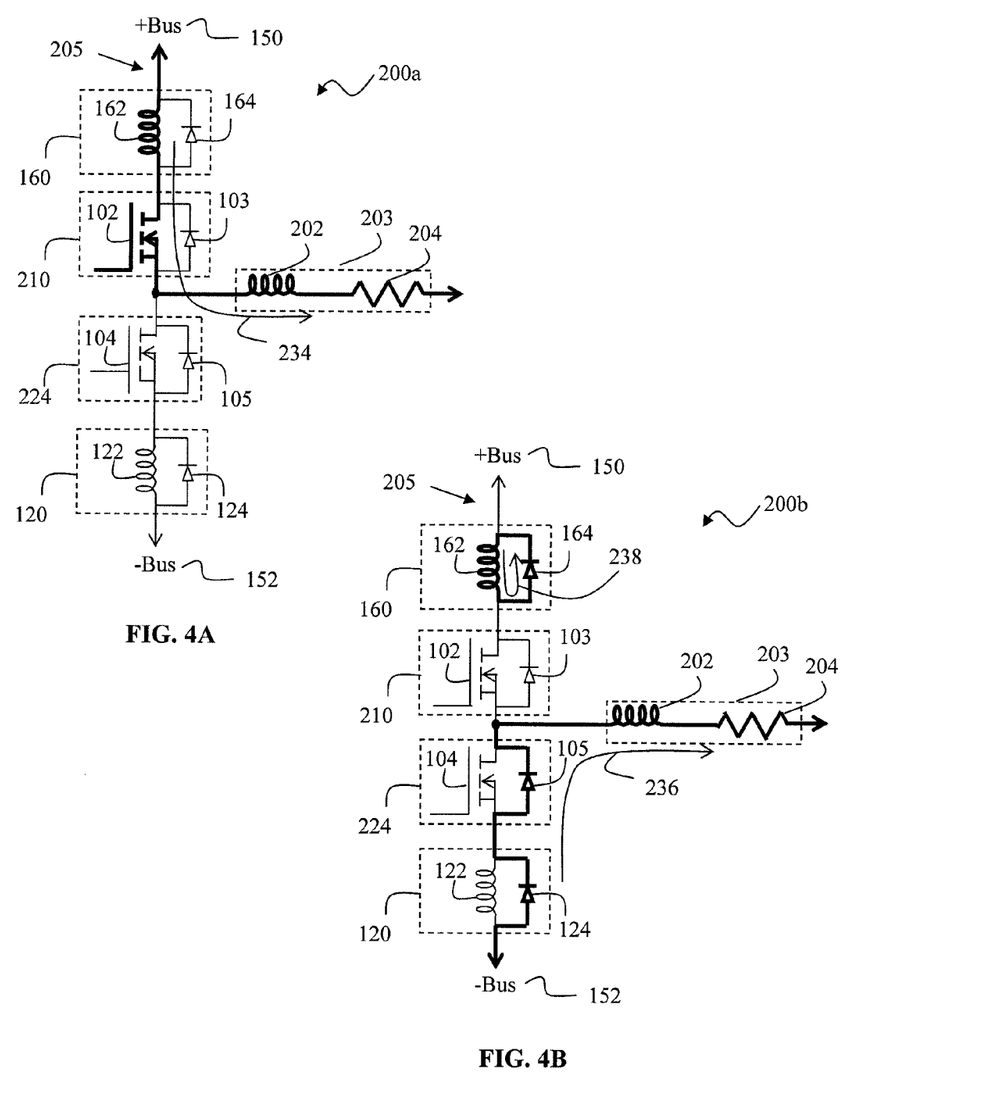
FIGS. 4A-4F illustrate the normal operating conditions of the shoot-through protection circuit of FIG. 3.

In operating condition 200a (e.g., at an intermediate time period), a current flow 234 occurs while the upper transistor 102 is turned on and the lower transistor 104 is turn off. Since the voltage potential on the right side of the load 203 is lower than the voltage +BUS at the positive terminal 150, the current 234 flows towards the right side of the load 203 through the inductor 162 of the upper delay module 160 and the upper transistor 102 of the upper switching module 210.

Between operating conditions 200a and 200b, the upper transistor 102 is turned off while the lower transistor 104 remains turned off. As shown, a current 236 flows towards the right side of the load 203 via the diode 124 of the lower delay module 120 and the body diode 105 of the lower switching module 224. The current 238 within the upper delay module 160 freewheels through the diode 164.

Figure 4C:
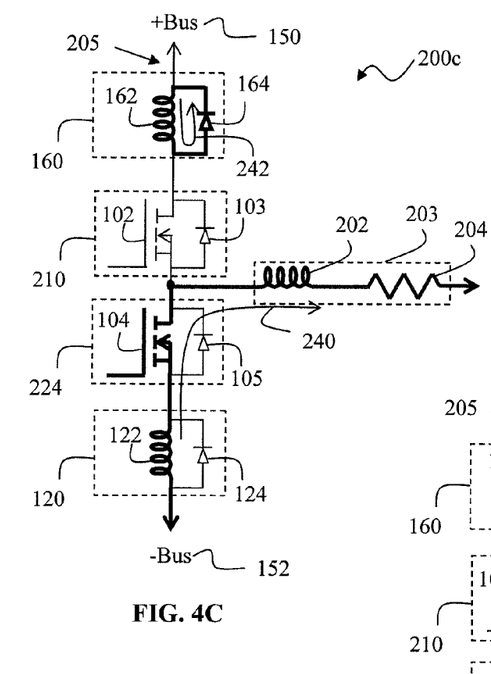

Between operating conditions 200b and 200c, the lower transistor 104 is turned on when its collector/drain-to-emitter/source voltage across is at or about zero while the upper transistor 102 remains off. A current 240 flows towards the right side of the load 203 through the inductor 122 of the lower delay module 120 and the lower transistor 104 of the lower switching module 224. The current 242 within the upper delay module 160 freewheels through the diode 164.

Figure 4D:
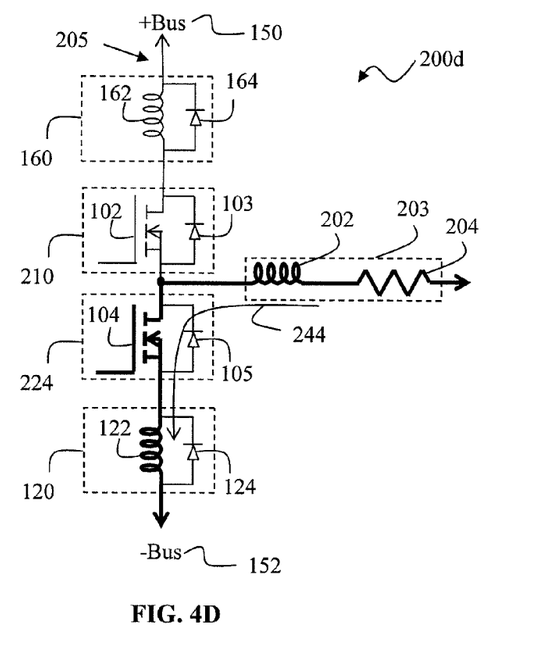

Between operating conditions 200c and 200d, the upper transistor 102 remains turned off and the lower transistor 224 remains turned on. However, the current through the load 203 reverses direction. The current 244 flows toward the left side of the load 203 and travels through the lower transistor 104 of the lower switching module 224 and the inductor 122 of the lower delay module 120.

Figure 4E:
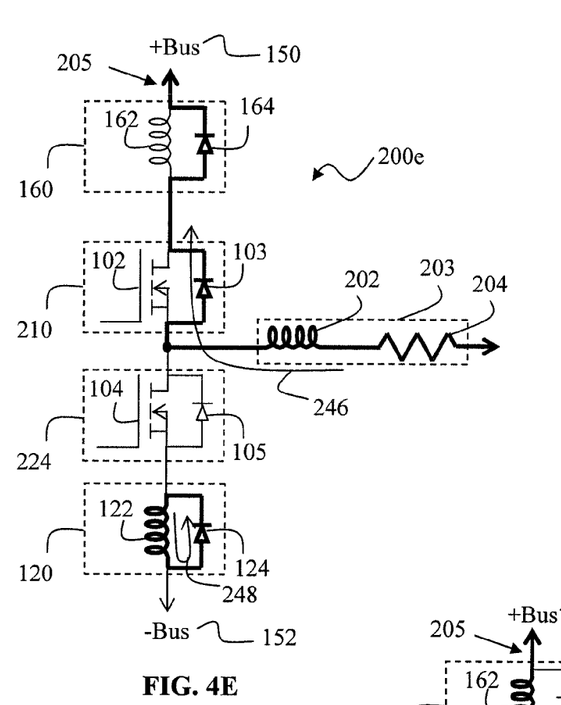

Between operating conditions 200d and 200e, the lower transistor 104 is turned off while the upper transistor 102 remains turned off. As shown, the current 246 flows toward the left side of the load 203 via the body diode 103 of the upper switching module 210 and the diode 164 of the upper delay module 160. The current 248 within the lower delay module 120 freewheels through the diode 124.

Figure 4F:
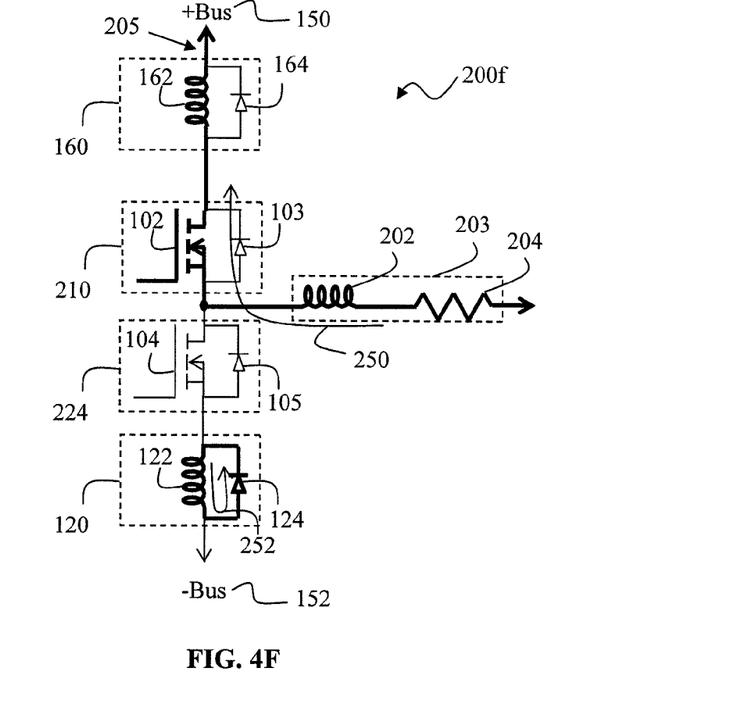

Between operating conditions 200e and 200f, the upper transistor 102 is turned on when its collector/drain-to-emitter/source voltage across is at or about zero voltage while the lower transistor 104 remains turned off. A current 250 flows toward the left side of the load 203 and travels through the upper transistor 102 of the upper switching module 210 and the inductor 162 of the upper delay module 160. The current 252 within the lower delay module 120 freewheels through the diode 124.

Between operating conditions 200f and 200a, the upper transistor 102 remains turned on and the lower transistor 104 remains turned off. However, the current through the load 203 reverses direction.

Figure 5A:
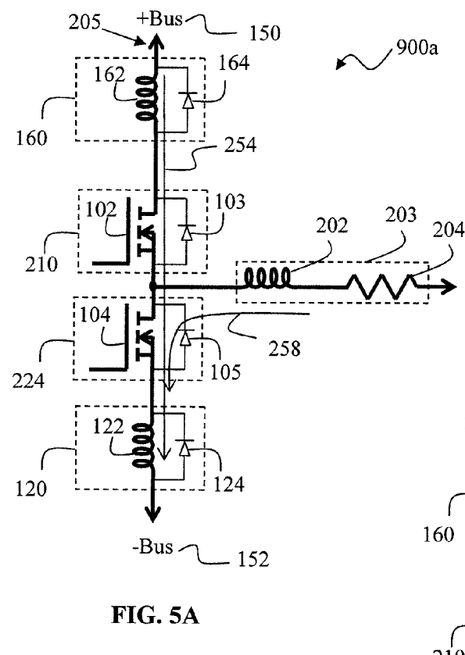
FIGS. 5A-B illustrate the shoot-through condition and the condition after a shoot-through event of the shoot-through protection circuit of FIG. 3.
Figure 5B:
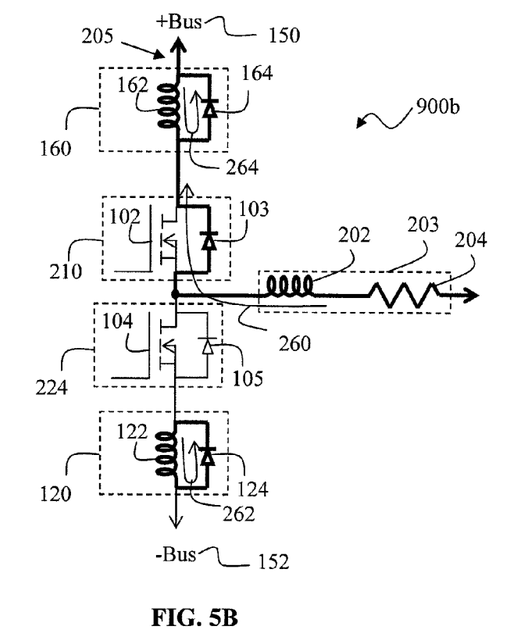

FIGS. 5A-B illustrate the shoot-through condition 900a and the condition 900b after a shoot-through event of the shoot-through protection circuit 100 of FIG. 3. As shown in FIG. 5A, condition 900a illustrates the presence of shoot-through current 254. In condition 900a, the shoot-through current 254 can occur when both the upper transistor 102 and the lower transistor 104 are on simultaneously, thus substantially increasing the current passing through each transistor 102 and 104. In addition, a load current 258 can further superimpose on the shoot-through current 254.

The shoot-through current 254 can be expressed as:

$$i_{shoot\_through}(t) = \frac{(V_{+bus} - V_{-bus})}{(L_T + L_B)} t, \quad \text{(Equation 1)}$$

where t represents time, $i_{shoot\_through}$ represents the shoot-through current 254, $V_{+bus}$ represents the voltage potential at the positive terminal 150, $V_{-bus}$ represents the voltage potential at the negative terminal 152, $L_T$ represents the inductance of the inductor 162 in the upper delay module 160 and $L_B$ represents the inductance of the inductor 122 in the lower delay module 120.

The current $i_{QT}$ flowing through the upper transistor 102 can be expressed as:

$$i_{QT}(t) = \frac{(V_{+bus} - V_{-bus})}{(L_T + L_B)} t = i_{shoot\_through}(t) \quad \text{(Equation 2)}$$

In addition, the current flowing through the lower transistor 104 can be expressed as:

$$i_{QB}(t) = \frac{(V_{+bus} - V_{-bus})}{(L_T + L_B)} t + i_{Load} = i_{shoot\_through}(t) + i_{load} \quad \text{(Equation 3)}$$

where $i_{load}$ represents the load current 258.

As expressed by Equations 1-3, the rate at which the shoot-through current 254 ($i_{shoot\_through}$) increases is dependent on the inductance value ($L_B$) of the inductor 122 and the inductance value ($L_T$) of the inductor 162. By appropriately selecting the inductance of inductors 122 and 162, the increase in the shoot-through current 254 can be delayed. Moreover, with the introduced delay, the control circuit 130 can have sufficient time to accurately detect the shoot-through current 254 and execute appropriate protection measures, such as safely deactivate one or both of the transistors 102 and 104.

FIG. 5B illustrates the condition 900b after the occurrence of a shoot-through phenomenon is detected, such as after the shoot-through condition 900a illustrated in FIG. 5A. For example, after the shoot-through condition 900a is detected by the shoot-through protection circuit 100 of FIG. 3, the circuit 100 can turn off at least one or both of the upper transistor 102 and the lower transistor 104. For purposes of illustration, in condition 900b, both the upper transistor 102 and the lower transistor 104 are turned off. This causes the load current 260 to freewheel toward the left side of the load 203 and travel upward through the body diode 103 of the upper switching module 210 and the upper delay module 160. Such upward movement of the current is caused by the orientation of the body diode 105 of the lower switching module 224 which prohibits downward current flow. In addition, the current 262 in the lower delay module 120 freewheels through the diode 124. The current 264 in the upper delay module 160 freewheels through the diode 164.

Figure 6:
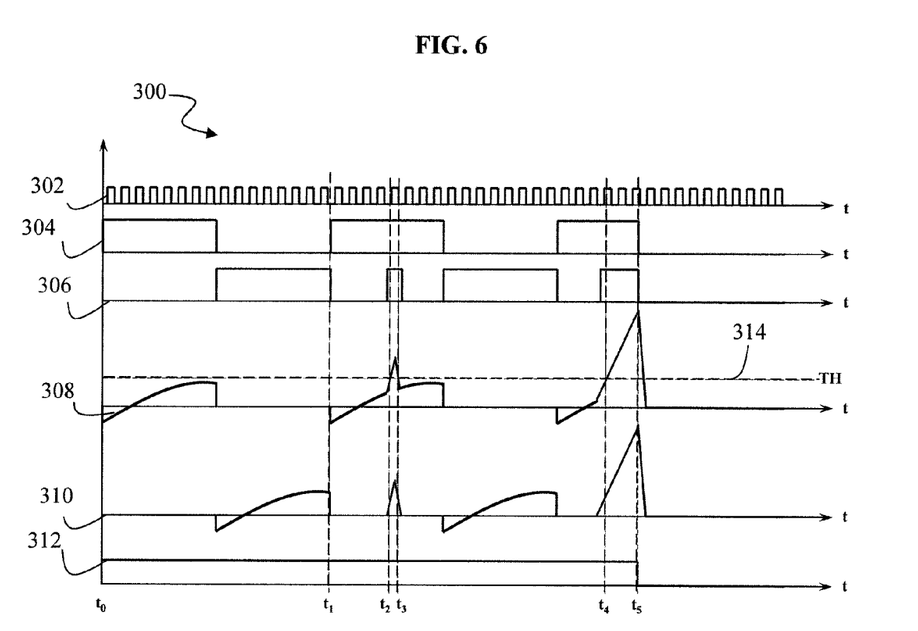
FIG. 6 illustrates a timing diagram for operating the shoot-through protection circuit of FIG. 3.

FIG. 6 illustrates a timing diagram 300 for operating the shoot-through protection circuit 100 of FIG. 3. The timing diagram 300 shows the waveforms of a clock signal 302, the gate/base voltage/current 304 of the lower transistor 104, the gate/base voltage/current 306 of the upper transistor 102, the output signal 308 of the lower sensor 126, the output signal 310 of the upper sensor 166, and an enable signal 312 of the control module 132. In some embodiments, the gate/base voltage/current 304 of the lower transistor 104 is measured at the gate/base terminal 108. In some embodiments, the gate/base current 306 of the upper transistor 102 is measured at the gate/base terminal 106. In the example illustrated in timing diagram 300, the period of time measurement, as described below, is three clock cycles. However, the number of cycles used can be adjustable. In some embodiments, the control module 132 senses the output current 308 or the output current 310 when the clock signal 302 is high.

In some embodiments, the control module 132 compares the output signals 308 and/or 310 to a predetermined threshold value. The enable signal 312 can be used to turn on or off at least one or both of the upper transistor 102 and the lower transistor 104. During normal operation, the enable signal 312 remains high. However, if the control module 132 senses that the output signals 308 and/or 310 continuously (or on average) exceed the threshold value for a given number of clock cycles, then the enable signal 312 will switch to logic low, thus turning off the power stage. In some embodiments, the control module 132 can trigger the enable signal 312 to logic low, thus shutting down one or both of the upper gate/base driver 136 and the lower gate/base driver 134, which in turn deactivates the upper transistor 102 and/or the lower transistor 104, respectively. The logic levels for enable signal 312 that result in turning off the power stage is a design choice. Accordingly, in some embodiments, a logic high of enable signal 312 can turn the power stage off.

For example, as shown in the timing diagram 300, during the interval $t_0$ to $t_2$, the upper transistor 102 and the lower transistor 104 operate normally because the output signal 308 of the lower transistor 104 does not exceed the threshold value 314, thus indicating that there is no shoot-through current to warrant a shutdown. However, during the interval $t_2$ to $t_3$, the lower transistor 104 and the upper transistor 112 may be on simultaneously resulting in the output signal 308 (e.g., representative of the current magnitude) increasing above the threshold value 314 during that time period. Yet, the enable signal 314 causes the control module 132 to ignore the spike in the output signal 308 because the output signal 308 exceeds the threshold value 314 for only one clock cycle, less than the requirement of three consecutive clock cycles for the control module 132 to trigger any precautionary measures. In contrast, from $t_4$ to $t_5$, because the output signal 308 exceeds the threshold value 314 for at least three clock cycles, the control module 132 can output the enable signal 312 to logic low and thus turn off the upper and lower gate/base drivers 134, 136. This is represented by the enable signal 312 transitioning from a logic high to a logic low at $t_5$. For example, when a shoot-through conditions occur at $t_4$, at least one the inductor 166 of the upper delay module 160 or the inductor 122 of the lower delay module 120 slows down the rise of the shoot-through current until the shoot-through event is detected at $t_5$, at which point the enable signal 312 transitions to a logic low to turn off the upper and lower gate/base drivers 134, 136.

Hence, the duration from $t_4$ to $t_5$ represents the amount of time the shoot-through circuit 100 takes to detect and respond to a shoot-through phenomenon. After the enable signal 132 turns off the upper and lower gate/base drivers 134 and 136, the gate/base voltage/current 304, the gate/base voltage/current 306, the output signal 308, and the output signal 310 fall to zero from $t_5$ and thereafter.

While the timing diagram 300 shows that the control module 132 determines whether shoot-through protection is needed based on the output signal 308 of the lower transistor 104, the control module 132 can also make such determination based on the output signal 310 of the upper transistor 102. In addition, instead of turning off both the upper and lower gate/base drivers 134 and 136 in response to shoot-through conditions, the control module 132 can shut off one of the gate/base drivers. In the example illustrated in the timing diagram 300, the period of time measurement is three consecutive clock cycles. However, the number of consecutive clock cycles is programmable and can be proportional on the amount of current of the transistors 102 and 104 can handle.

Figure 7A:
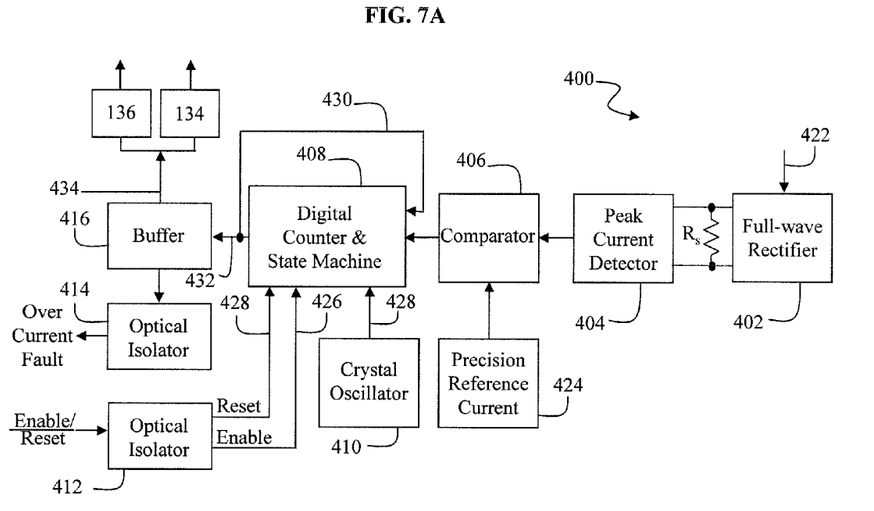
FIGS. 7A-B illustrate exemplary digital and analog control circuits of the shoot-through protection circuit.
Figure 7B:
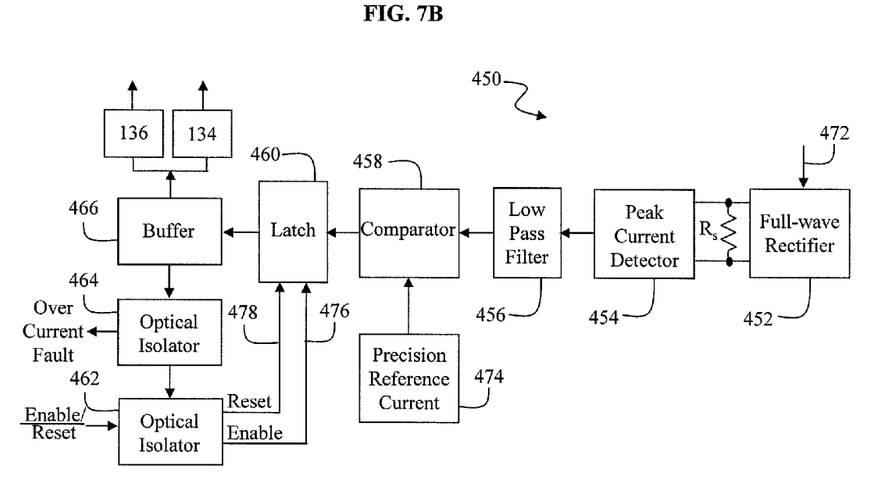

FIGS. 7A-B illustrate exemplary digital and analog control circuits of the shoot-through protection circuit 100. FIG. 7A shows an exemplary implementation of the control module 132 in digital circuitry 400. Control circuit 400 includes a full-wave rectifier 402, a peak-wave detector 404, a comparator 406, a digital counter and state machine 408, a crystal oscillator 410, optical isolators 412 and 414, and a buffer 416.

The full-wave rectifier 402 converts the negative half wave of an alternating input current 422 into a positive half-wave signal. The peak-wave detector 404 detects a peak level of the positive half-wave signal which is then compared to a reference threshold current 424 by the comparator 406. In some embodiments, the comparator 406 is a high-speed comparator. The digital counter and state machine 408 can take as an input the output of the comparator 406 that indicates whether the output of the peak-wave detector 404 is above the threshold current 424. The digital counter and state machine 408 also can take as an input a clock signal 428 generated by the crystal oscillator 410, an enable signal 426, a reset signal 428 (via, for example, the optical isolator 412), and/or a feedback signal 430. The enable signal 426 and the reset signal 428 can be generated by one or more outside components, such as by a main controller (not shown). The optical isolator 412 can be configured to isolate the shoot-through protection circuit 100 from outside circuit components and also prevent high voltages from being coupled into outside circuit components under abnormal circumstances.

In operation, the digital counter and state machine 408 can allow the control circuit 132 to ignore any occurrences where the peak current from the peak-wave detector 404 is lower than the reference threshold current 424 or where the peak current is above the threshold current 424 for less than a given number of consecutive cycles of the clock signal 428. However, if the peak current is equal to or above the threshold current 424 for a certain number of consecutive clock cycles, this can be used to signify a shoot-through event. In response, the digital counter and state machine 408 can be used, with the enable signal 426, to turn off at least one or both of the upper transistor 102 or the lower transistor 104. In some embodiments, after a shoot-through fault is detected, an outside component, such as the main controller, can trigger the reset signal 428, prompting the digital counter and state machine 408 to clear the shoot-through fault. In response to the reset signal 428, the digital counter and state machine 408 can interact with the enable signal 426 to turn on one of the upper transistor 102 or the lower transistor 104 after a shoot-through event.

In some embodiments, an output signal 432 of the digital counter and state machine 408 includes instructions to turn on or off the upper transistor 102 and/or the lower transistor 104. The output signal 432 can be provided to the buffer 416 for amplification. The buffer 416, in turn, can then supply an amplified output 434 to the upper gate/base driver 136 and/or the lower gate/base driver 134 to control the activation or deactivation of the respective transistors 102, 104.

In some embodiments, if a shoot-through fault is detected by the digital counter and state machine 408 leading to the deactivation of at least one of the transistors 102 and/or 104, the buffer 416 sends a signal to an outside circuit component, such as to the main controller, via the optical isolator 414. The "over current fault" signal can be used to notify outside circuit component(s) of the shoot-through fault. The optical isolator 414 can provide a similar isolation function as the optical isolator 412.

FIG. 7B shows an exemplary implementation of the control module 132 in analog circuitry 450. Control circuit 450 includes a full-wave rectifier 452, a peak-current detector 454, a low-pass filter 456, a comparator 458, a latch 460, optical isolators 462 and 464, and a buffer 466.

The full-wave rectifier 452 and the peak-current detector 454 of the analog circuit 450 operate on the input current 472 in a similar fashion as the corresponding devices 402 and 404 in the digital circuit 400. The low-pass filter 456 attenuates the high-frequency component of the output signal of the peak-level detector 454. The resulting waveform is compared to a reference threshold current 474 by the comparator 458. The latch 460 can take as an input the output of the comparator 458 which indicates whether the output of the low-pass filter 456 is above the reference threshold current 474. The latch 460 also can take as inputs an enable signal 476 and/or a reset signal 478 via, for example, the optical isolator 462. In some embodiments, the enable signal 476, the reset signal 478 and the optical isolator 462 operate in a similar fashion as their counterparts 426, 428 and 412, respectively, of the digital circuit 400.

In operation, the latch 460 can operate in a similar fashion as the digital counter and state machine 408 of the digital circuit 400. In some embodiments, if the current from the low-pass filter 456 is equal to or above the threshold current 474 for a certain number of consecutive clock cycles, this can be used to signify a shoot-through event. In response, the latch 460, using enable signal 476, can turn off at least one or both of the upper transistor 102 and the lower transistor 104. In some embodiments, after the latch 460 shuts down one or both of the transistors 102, 104 during a shoot-through event, the latch remains inactive or deactivated until another circuit component, such as the main controller, prompts further actions from the latch 460 by activating, for example, the reset signal 478 to prompt the latch 460 to clear the shoot-through fault. In response to the reset signal 478, the latch 460 can interact with the enable signal 476 to turn on one of the upper transistor 102 or the lower transistor 104.

In some embodiments, the buffer 466 operates similarly as the buffer 416 of the digital circuit 400. For example, the buffer 466 can amplify the output of the latch 460 and supply the amplified output to the upper gate/base driver 136 and/or the lower gate/base driver 134 to control the activation or deactivation of the respective transistors 102, 104. The buffer 466 can also send a signal to an outside circuit component, such as to the main controller, via the optical isolator 414 to notify the outside circuit component of a shoot-through fault.

Figure 8:
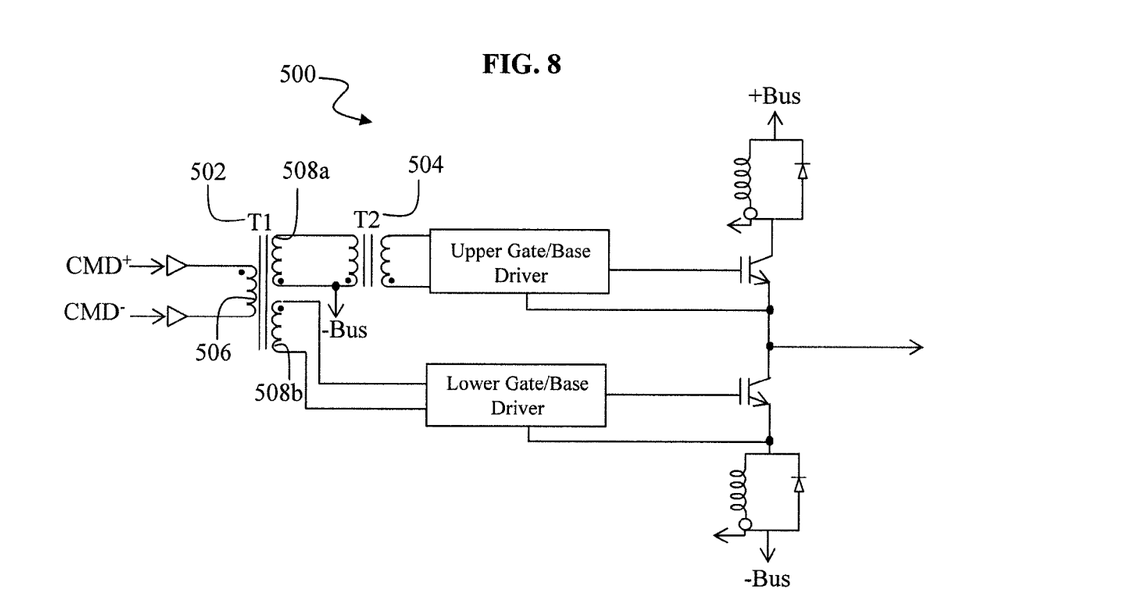
FIG. 8 illustrates an exemplary interlocking circuit of the shoot-through protection circuit.

FIG. 8 illustrates an exemplary interlocking circuit 500 of the shoot-through protection circuit 100. The circuit 500 includes two transformers 502, 504. The transformer 502 includes a primary winding 506 coupled to two secondary windings 508a, 508b. Each of the secondary windings 508a and 508b can have a different polarity. When the primary winding 506 receives two command signals, one of which may be a reference signal such as ground, one of the secondary windings 508a, 508b is adapted to be in phase with the signals while the other is out of phase with the signals. This can be used to insure that the gate/base driver connected to one of the secondary windings 508a, 508b is turned on while the gate/base driver connected to the other is turned off. In some embodiments, the transformer 504 is used to force the upper secondary winding 508a to have about the same potential as the lower secondary winding 508b so as to eliminate the high dV/dt common mode problem. In some embodiments, the transformer 504 is connected to the lower secondary winding 508b and can be used to force the lower secondary winding 508a to maintain about the same potential as the upper secondary winding 508a.

Figure 9:
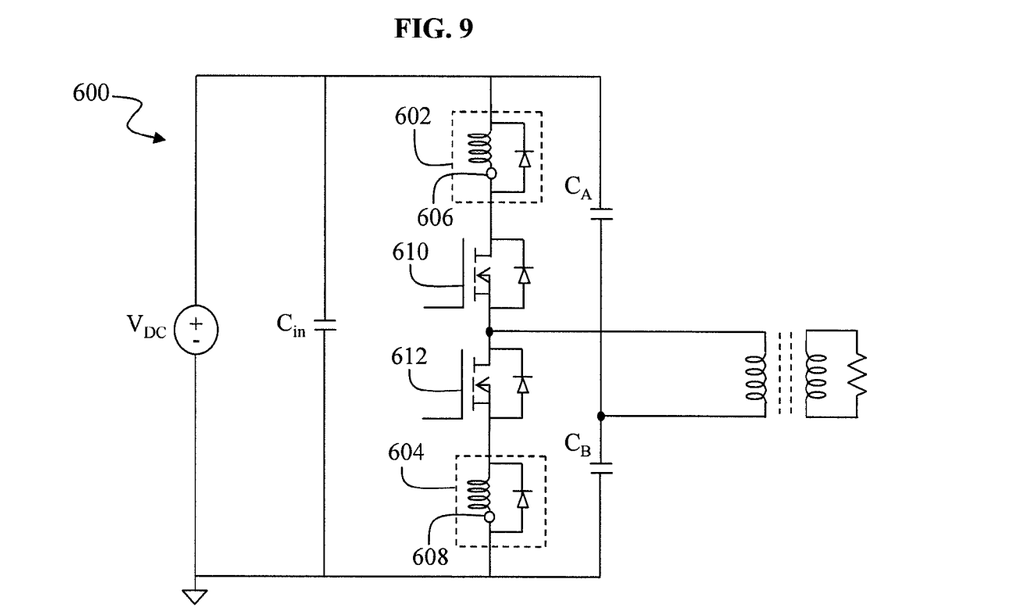
FIG. 9 illustrates a half-bridge circuit topology including the shoot-through protection circuit according to some embodiments.

FIG. 9 illustrates a half-bridge circuit topology 600 including the shoot-through protection circuit 100 according to some embodiments. The half-bridge circuit 600 can include one or both of the upper delay module 602 and the lower delay module 604 for delaying the rate of increase of a shoot-through current. In addition, the current sensed by the detector 606 of the upper delay module 602 and/or by the detector 608 of the lower delay module 604 can be used by the control circuit 130 (not shown) to accurately determine whether shoot-through protection is required, such as deactivating one or both of the transistors 610, 612 to ensure that they are not turned on simultaneously.

Figure 10A:
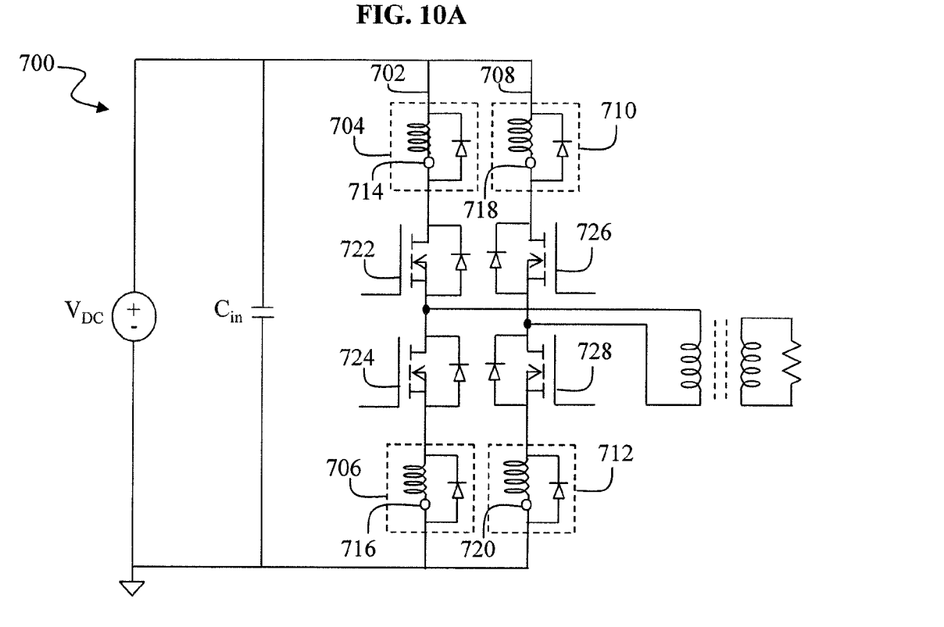
FIGS. 10A-B illustrate full-bridge circuit topologies including the shoot-through protection circuit according to some embodiments.
Figure 10B:
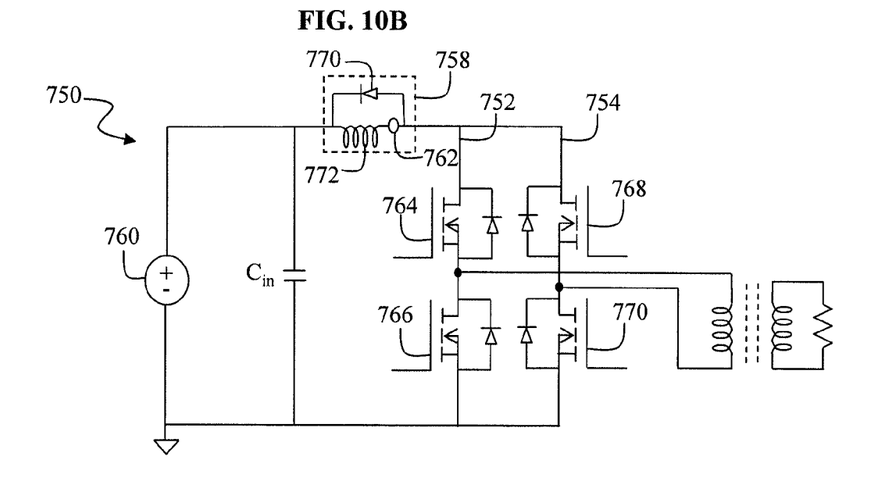

FIGS. 10A-B illustrate full-bridge circuit topologies including the shoot-through protection circuit 100 according to some embodiments. In FIG. 10A, the full-bridge circuit 700 includes a first switching branch 702 in parallel with a second switching branch 708. As shown, the first switching branch 702 includes an upper delay module 704 and a lower delay module 706. Similarly, the second switching branch 708 includes an upper delay module 710 and a lower delay module 712. In some embodiments, the first switching branch 702 includes either one of the upper delay module 704 or the lower delay module 706 for providing shoot-through current delay. In some embodiments, the second switching branch 708 includes either one of the upper delay module 710 or the lower delay module 712 for providing shoot-through current delay. In addition, the current sensed by the detector 714 of the upper delay module 704, by the detector 716 of the lower delay module 706, by the detector 718 of the upper delay module 710 and/or by the detector 720 of the lower delay module 712 can be used by the control circuit 130 (not shown) to accurately determine whether shoot-through protection is required. Exemplary protection measures include turning off all four transistors 722, 724, 726 and 728, a pair of the transistors 722, 728 or a pair of the transistors 724, 726.

FIG. 10B illustrates another exemplary implementation of a full-bridge topology 750 including the shoot-through protection circuit 100. The full-bridge circuit 750 includes a first switching branch 752 in parallel with a second switching branch 754. A delay module 758 is connected in series between the pair of switching branches 752, 754 and a positive terminal of an input voltage supply 760. The delay module 758 includes a diode 770 in parallel with an inductor 772, where the cathode of the diode 770 is coupled to the positive terminal of the power supply 760 and the anode of the diode 770 is coupled to the pair of the switching branches 752, 754. In addition, the current sensed by the detector 762 of the delay module 758 can be used by the control circuit 130 (not shown) to accurately determine whether shoot-through protection is required, such as turning off all four transistors 764, 766, 768 and 770, a pair of the transistors 764, 770 or a pair of the transistors 766, 768.

Figure 11:
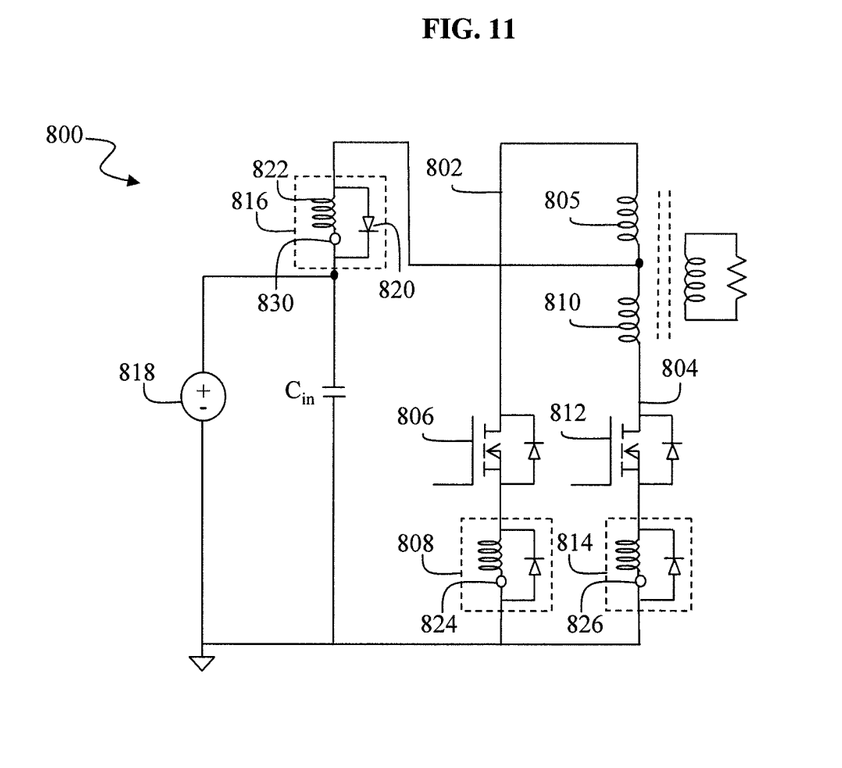
FIG. 11 illustrates a push-pull circuit topology including the shoot-through protection circuit according to some embodiments.

FIG. 11 illustrates a push-pull circuit topology 800 including the shoot-through protection circuit 100 according to some embodiments. The push-pull circuit 800 includes a pair of transistor branches 802, 804 that drives either a positive or a negative current into a load. The branch 802 includes an inductor 805 in series with a transistor 806 and a first delay module 808. Similarly, the branch 804 includes an inductor 810 in series with a transistor 812 and a second delay module 814. A third delay module 816 is connected in series between the pair of transistor branches 802, 804 and a positive terminal of an input voltage supply 818. The third delay module 816 includes a diode 820 in parallel with an inductor 822, where the anode of the diode 820 is coupled to the positive terminal of the power supply 816 and the cathode of the diode 820 is coupled to the pair of transistor branches 802, 804. In some embodiments, instead of using all three delay modules 824, 826, 816 to delay the rate of increase of a shoot-through current, the push-pull circuit 800 can include only one or two of the delay modules 824, 826, 816.

In addition, the current sensed by the detector 824 of the first delay module 808, by the detector 826 of the second delay module 814 and/or by the detector 830 of the third delay module 816 can be used by the control circuit 130 (not shown) to accurately determine whether shoot-through protection is required. Exemplary protection measures include turning off one or both of the transistors 806, 812.

The technology has been described in terms of particular embodiments. The alternatives described herein are examples for illustration only and not to limit the alternatives in any way. The steps of the technology can be performed in a different order and still achieve desirable results. Other embodiments are within the scope of the following claims.

What is claimed is:

1. A switching apparatus for protecting against a shoot-through current, the switching apparatus comprising:
   a first transistor including first, second and third terminals, the first terminal of the first transistor coupled to a first power terminal, the third terminal of the first transistor including a gate or base of the first transistor;
   a second transistor including first, second and third terminals, the first terminal of the second transistor coupled to a second power terminal, the second terminal of the second transistor coupled to the second terminal of the first transistor, the third terminal of the second transistor including a gate or base of the second transistor;
   a first circuit module including an inductor in parallel with a diode, the first circuit module connected between the first terminal of the second transistor and the second power terminal, wherein an inductance of the inductor is selected to delay a rate of increase in the shoot-through current and the diode is configured to mitigate spikes in the shoot-through current;
   a first current sensor coupled to the first circuit module or the first terminal of the second transistor to detect the shoot-through current after being delayed by the first circuit module and generate a signal if the shoot-through current is detected indicating that both the first and second transistors are on; and
   a control circuit coupled to the third terminal of the first or second transistors, the control circuit including a feedback circuit for turning off at least one of the first or second transistors when the signal from the first current sensor is received to prevent the shoot-though current from traversing the first and second transistors, wherein the first circuit module delays the rate of increase of the shoot-through current until the first current sensor detects the shoot-through current and the control circuit turns off at least one of the first and second transistors prior to the shoot-through current traversing the first and second transistors.

2. The apparatus of claim 1 further comprising a second circuit module including an inductor in parallel with a diode, the second circuit module connected between the first terminal of the first transistor and the first power terminal, wherein an inductance of the inductor of the second circuit module is selected to delay the rate of increase in the shoot-through current and the diode of the second circuit module is configured to mitigate spikes in the shoot-through current.

3. The apparatus of claim 2 further comprising a second current sensor coupled to the second circuit module or the first terminal of the first transistor, the feedback circuit for turning off at least one of the first or second transistors further based on a signal from the second current sensor.

4. The apparatus of claim 1 wherein the first power terminal is connected to a positive voltage power source and the second power terminal is connected to a negative voltage power source.

5. The apparatus of claim 1 wherein the first power terminal is connected to a negative voltage power source and the second power terminal is connected to a positive voltage power source.

6. The apparatus of claim 1 further comprising:
a gate or base voltage sensor coupled to the third terminal of the first transistor; and
an interlock circuit connected between the gate or base voltage sensor and the third terminal of the second transistor, the interlock circuit for turning off the second transistor based on a signal from the gate or base voltage sensor.

7. The apparatus of claim 1 wherein the feedback circuit is configured to turn off at least one of the first or second transistors when the current sensed by the first current sensor is above a predetermined threshold for a predetermined period of time.

8. The apparatus of claim 1 wherein the control circuit comprises a digital circuit.

9. The apparatus of claim 1 wherein the control circuit comprises an analog circuit.

10. The apparatus of claim 1 wherein the diode in the first circuit module comprises a silicon-carbide diode.

11. The apparatus of claim 1 wherein:
the first transistor includes a diode connected between the first and second terminals of the first transistor, the diode of the first transistor is anti-parallel in polarity with the first transistor; and
the second transistor includes a diode connected between the first and second terminals of the second transistor, the diode of the second transistor is anti-parallel in polarity with the second transistor.

12. The apparatus of claim 4 wherein a cathode of the diode in the first circuit module is connected to the first terminal of the second transistor and the anode of the diode in the first circuit module is connected to the second power terminal.

13. The apparatus of claim 1 wherein the control circuit includes a comparator for comparing the signal from the first current sensor to a reference signal, the feedback circuit is adapted to turn off at least one of the first or second transistors based on an output signal of the comparator.

14. The apparatus of claim 1 wherein the control circuit includes a latch for (i) detecting the shoot-through current when the signal from the first current sensor is greater than or equal to a threshold for a plurality of consecutive clock cycles, indicating that both the first and second transistors are on; and (ii) interacting with an enable signal to turn off at least one of the first or second transistors in response to detecting the shoot-through current.

15. The apparatus of claim 14 wherein the latch is adapted to turn on one of the first and second transistors based on a reset signal signaling the end of a shoot-through event.

16. The apparatus of claim 1 wherein the control circuit includes a digital counter and state machine for (i) detecting the shoot-through current when the signal from the first current sensor is greater than or equal to a threshold for a plurality of consecutive clock cycles, indicating that both the first and second transistors are on; and (ii) interacting with an enable signal to turn off at least one of the first or second transistors in response to detecting the shoot-through current.

17. The apparatus of claim 16 wherein the digital counter and state machine is adapted to turn on one of the first and second transistors based on a reset signal signaling the end of a shoot through event.

18. The apparatus of claim 17, wherein at least one of the enable signal or the reset signal is controlled by a main controller.

19. The apparatus of claim 1 wherein the apparatus is included in a half-bridge circuit or a full-bridge circuit.

20. A switching apparatus for protecting against a shoot-through current, the switching apparatus comprising:
a first circuit module including an inductor in parallel with a diode, a first terminal of the first circuit module coupled to a first power terminal wherein an inductance of the inductor is selected to delay a rate of increase in the shoot-through current and the diode is configured to mitigate spikes in the shoot-through current;
a first transistor including first, second and third terminals, the first terminal of the first transistor coupled to a second terminal of the first circuit module, the second terminal of the first transistor coupled to a second power terminal, the third terminal of the first transistor including a gate or base of the first transistor;
a second transistor including first, second and third terminals, the first terminal of the second transistor coupled to the second terminal of the first circuit module, the second terminal of the second transistor coupled to the second power terminal, the third terminal of the second transistor including a gate or base of the second transistor;
a current sensor coupled to the first circuit module to detect the shoot-through current after being delayed by the first circuit module and generate a signal if the shoot-through current is detected indicating that both the first and second transistors are on; and
a control circuit coupled to the third terminal of the first or second transistors, the control circuit including a feedback circuit for turning off at least one of the first or second transistors when the signal from the current sensor is received to prevent the shoot-though current from traversing the first and second transistors, wherein the first circuit module delays the rate of increase of the shoot-through current until the current sensor detects the shoot-through current and the control circuit turns off at least one of the first and second transistors prior to the shoot-through current traversing the first and second transistors.

21. The apparatus of claim 20 wherein the apparatus is included in a push-pull circuit.

* * * * *